US010490688B2

(12) United States Patent
Krause et al.

(10) Patent No.: US 10,490,688 B2
(45) Date of Patent: Nov. 26, 2019

(54) MULTI JUNCTIONS IN A SEMICONDUCTOR DEVICE FORMED BY DIFFERENT DEPOSITION TECHNIQUES

(71) Applicant: Soitec, Crolles (FR)

(72) Inventors: Rainer Krause, Mainz-Kostheim (DE); Bruno Ghyselen, Syssinet (FR)

(73) Assignee: Soitec, Bernin (FR)

( * ) Notice: Subject to any disclaimer, the term of this patent is extended or adjusted under 35 U.S.C. 154(b) by 132 days.

(21) Appl. No.: 14/350,435

(22) PCT Filed: Oct. 8, 2012

(86) PCT No.: PCT/IB2012/002062
§ 371 (c)(1),
(2) Date: Apr. 8, 2014

(87) PCT Pub. No.: WO2013/054184
PCT Pub. Date: Apr. 18, 2013

(65) Prior Publication Data
US 2014/0261653 A1    Sep. 18, 2014

(30) Foreign Application Priority Data

Oct. 11, 2011   (FR) ..................................... 11 59154

(51) Int. Cl.
*H01L 31/18*     (2006.01)
*H01L 21/02*     (2006.01)
(Continued)

(52) U.S. Cl.
CPC ........ *H01L 31/184* (2013.01); *H01L 21/0262* (2013.01); *H01L 21/02538* (2013.01);
(Continued)

(58) Field of Classification Search
CPC ............... H01L 31/184; H01L 31/0725; H01L 31/0693; H01L 21/02538; H01L 21/0262
See application file for complete search history.

(56) References Cited

U.S. PATENT DOCUMENTS

| 4,404,421 A | 9/1983 | Fraas |
| 4,686,323 A | 8/1987 | Bliter et al. |
| (Continued) | | |

FOREIGN PATENT DOCUMENTS

| CN | 101950774 A | 1/2011 |
| CN | 102184980 A | 9/2011 |
| (Continued) | | |

OTHER PUBLICATIONS

Singapore Written Opinion for Singapore Application No. 11201400569U dated Oct. 24, 2014, 8 pages.
(Continued)

*Primary Examiner* — Tae-Sik Kang
(74) *Attorney, Agent, or Firm* — TraskBritt

(57) ABSTRACT

A semiconductor device, in particular a solar cell is formed on the basis of a hybrid deposition strategy using MOCVD and MBE in order to provide lattice matched semiconductor compounds. To this end, the MBE may be applied for providing a nitrogen-containing semiconductor compound that allows a desired low band gap energy and a lattice matched configuration with respect to gallium arsenide substrates.

8 Claims, 4 Drawing Sheets

(51) Int. Cl.
*H01L 31/0304* (2006.01)
*H01L 31/0687* (2012.01)
*H01L 31/0693* (2012.01)
*H01L 31/0725* (2012.01)

(52) U.S. Cl.
CPC .. *H01L 21/02631* (2013.01); *H01L 31/03044* (2013.01); *H01L 31/03046* (2013.01); *H01L 31/0687* (2013.01); *H01L 31/0693* (2013.01); *H01L 31/0725* (2013.01); *H01L 31/1844* (2013.01); *H01L 31/1848* (2013.01); *H01L 31/1892* (2013.01); *Y02E 10/544* (2013.01); *Y02P 70/521* (2015.11)

(56) References Cited

U.S. PATENT DOCUMENTS

| | | | |
|---|---|---|---|
| 4,984,052 | A | 1/1991 | Koshino et al. |
| 5,458,694 | A | 10/1995 | Nuyen |
| 5,479,043 | A | 12/1995 | Nuyen |
| 5,689,123 | A | 11/1997 | Major et al. |
| 5,853,497 | A | 12/1998 | Lillington et al. |
| 6,100,546 | A | 8/2000 | Major et al. |
| 6,130,147 | A | 10/2000 | Major et al. |
| 6,252,287 | B1* | 6/2001 | Kurtz .............. H01L 31/0725 136/252 |
| 6,281,426 | B1 | 8/2001 | Olson et al. |
| 6,316,715 | B1* | 11/2001 | King ............... H01L 31/0304 136/249 |
| 6,750,480 | B2 | 6/2004 | Welser et al. |
| 6,815,736 | B2 | 11/2004 | Mascarenhas |
| 7,019,339 | B2 | 3/2006 | Atwater, Jr. et al. |
| 7,141,834 | B2 | 11/2006 | Atwater, Jr. et al. |
| 7,238,622 | B2 | 7/2007 | Atwater, Jr. et al. |
| 7,339,109 | B2 | 3/2008 | Stan et al. |
| 7,341,927 | B2 | 3/2008 | Atwater, Jr. et al. |
| 7,755,109 | B2 | 7/2010 | Atwater, Jr. et al. |
| 7,785,989 | B2 | 8/2010 | Sharps et al. |
| 7,807,921 | B2 | 10/2010 | Fetzer et al. |
| 7,825,328 | B2 | 11/2010 | Li |
| 7,846,759 | B2 | 12/2010 | Atwater, Jr. et al. |
| 7,994,419 | B2 | 8/2011 | Pan et al. |
| 8,119,904 | B2 | 2/2012 | Guha et al. |
| 8,236,600 | B2 | 8/2012 | Cornfeld |
| 8,895,838 | B1* | 11/2014 | Welser ............... G02B 1/115 136/255 |
| 9,303,316 | B1* | 4/2016 | Shufflebotham ...... C23C 14/566 |
| 2002/0002992 | A1* | 1/2002 | Kariya ............ H01L 31/022466 136/255 |
| 2004/0166681 | A1 | 8/2004 | Iles et al. |
| 2005/0161078 | A1 | 7/2005 | Aiken |
| 2006/0021565 | A1 | 2/2006 | Zahler et al. |
| 2006/0112986 | A1 | 6/2006 | Atwater et al. |
| 2006/0185582 | A1 | 8/2006 | Atwater et al. |
| 2007/0131275 | A1 | 6/2007 | Kinsey et al. |
| 2008/0211061 | A1 | 9/2008 | Atwater, Jr. |
| 2008/0311686 | A1 | 12/2008 | Morral |
| 2009/0014061 | A1* | 1/2009 | Harris, Jr. .......... H01L 31/0304 136/255 |
| 2009/0038678 | A1 | 2/2009 | Pan et al. |
| 2009/0044860 | A1 | 2/2009 | Pan et al. |
| 2010/0035418 | A1 | 2/2010 | Faure et al. |
| 2010/0083997 | A1 | 4/2010 | Hovel |
| 2010/0083999 | A1 | 4/2010 | Hovel |
| 2010/0116327 | A1 | 5/2010 | Cornfeld |
| 2010/0122764 | A1 | 5/2010 | Newman |
| 2010/0126573 | A1 | 5/2010 | Youtsey et al. |
| 2010/0186822 | A1 | 7/2010 | Pan et al. |
| 2010/0218813 | A1 | 9/2010 | Guha et al. |
| 2011/0232730 | A1* | 9/2011 | Jones .................. C22C 28/00 136/255 |
| 2011/0303268 | A1* | 12/2011 | Tan ................... H01L 31/03046 136/255 |
| 2012/0086016 | A1 | 4/2012 | Yang et al. |
| 2012/0138132 | A1 | 6/2012 | Guha et al. |
| 2012/0240987 | A1* | 9/2012 | King ............... H01L 31/035236 136/255 |
| 2012/0285520 | A1 | 11/2012 | Bedell et al. |

FOREIGN PATENT DOCUMENTS

| | | |
|---|---|---|
| EP | 1065734 A2 | 1/2001 |
| WO | 9952155 A1 | 10/1999 |
| WO | 2011009857 A1 | 1/2011 |

OTHER PUBLICATIONS

Aiken et al., Development of a High Efficiency Mechanically Stacked Multi-Junction Solar Cell, National Aeronautics and Space Administration, Cleveland, OH (2005), pp. 95-100.

Bauhuis et al., Thin Film GaAs Solar Cells with Increased Quantum Efficiency Due to Light Reflection, Solar Energy Materials & Solar Cells, vol. 83, (2004), pp. 81-90.

Beaumont et al., Mechanically Stacked Two-Tandem Concentrator Solar Cell Concept, of the Photovoltaic Specialists Conference, Kissimmee, May 21-25, 1990, vol. 1, No. 21, May 1990, Institute of Electrical and Electronics Engineers, pp. 47-52.

Bett et al., 30% Monolithic Tandem Concentrator Solar Cells for Concentrations Exceeding 1000 Suns, Photovoltaic Specialists Conference, 2000. Conference Record of the Twenty-Eighth IEEE, Sep. 15, 2000, pp. 961-964.

Boisvert et al., Development of Space Solar Cells at Spectrolab, Photovoltaic Specialists Conference (PVSC), 2011 37th IEEE, Digital Object Identifier: , Publication Year: 2011 , pp. 001528-001531.

Chen et al., Integration of Thin Layers of Single-Crystalline InP with Flexible Substrates, Applied Physics Letters, vol. 92, (2008), pp. 212109-212109-3.

Griggs et al., Design Approaches and Materials Processes for Ultrahigh Efficiency Lattice Mismatched Multi-Junction Solar Cells, Conference Record of the 2006 IEEE 4th World Conference on Photovoltaic Energy Conversion (IEEE Cat. No. 06CH37747),, May 1, 2006, pp. 857-860, XP031041755, ISBN: 978-1-4244-0016-4.

Hayashi et al., Materials Issues for the Heterogeneous Integration of III-V Compounds, Journal of the Electrochemical Society, vol. 153, No. 12, (2006), pp. G101-G1014.

International Search Report for International Application No. PCT/IB2012/002062 dated Dec. 4, 2012, 3 pages.

Jackrel et al., Dilute Nitride GaInNAs and GaInNAsSb Solar Cells by Molecular Beam Epitaxy, Journal of Applied Physics, vol. 101, (2007), pp. 114916-1-114916-8.

Law et al., Semiconductor-Bonded III-V Multijunction Space Solar Cells, Proc. 34th IEEE Photovoltaic Specialists Conference, Philadelphia, (2009), pp. 002237-002240.

Olson et al., Structure of Ge(100) Surfaces for High-Efficiency Photovoltaic Applications, Presented at the 2nd World Conference and Exhibition on Photovoltac Solar Energy Conversion; Jul. 6-10, 1998, 7 pages.

Schermer et al., Epitaxial Lift-Off for Large Area Thin Film III/V Devices, Phys. Stat. Sol. (a), vol. 202, No. 4, (2005), pp. 501-508.

Sharps et al., Wafer Bonding for Use in Mechanically Stacked Multi-Bandgap Cells, 26th PVSC, Sep. 30-Oct. 3, 1997, pp. 895-898.

Takamoto et al., Future Development of InGaP/(In)GaAs Based Multijuntion Solar Cells, Proceedings of the 31st IEEE PVSC, Jan. 3-7, 2005, Lake Buena Vista, FL; pp. 519-524.

Tanabe et al., Direct-Bonded GaAs/InGaAs Tandem Solar Cell, Applied Physics Letter, vol. 89, (2006), pp. 102106-1-102106-3.

Tatavarti et al., Lightweight, Low-Cost InGaP/GaAs Dual-Junction Solar Cells on 4" Epitacial Liftoff (ELO) Wafers, Process of SPIE, vol. 7407, Aug. 20, 2009, pp. 74070B-1-74070B-6.

Tseng et al., Performance of GaAs/Mirror/Cu-Substrate Thin-Film Solar Cells, IEEE Transactions on Electron Devices, vol. 58, No. 11, Nov. 2011, pp. 3898-3904.

(56) References Cited

OTHER PUBLICATIONS

Zahler et al., Ge Layer Transfer to Si for Photovoltaic Applications, Mat. Res. Soc. Symp. Proc., vol. 681E, (2001), Materials Research Society, pp. I4.5.2-I4.5.6.
Zahler, James Michael, Thesis, Materials Integration for High-Performance Photovoltaics by Wafer Bonding, California Institute of Technology,(2005), 303 pages.
International Written Opinion for International Application No. PCT/IB2012/002062 dated Apr. 15, 2014, 6 pages.
International Preliminary Report on Patentability for International Application No. PCT/IB2012/002062 dated Apr. 15, 2014, 7 pages.
First Chinese Office Action for Chinese Application No. 201280048760.9 dated Sep. 25, 2015, 15 pages.
Second Chinese Office Action for Chinese Application No. 201280048760.9 dated May 31, 2016, 17 pages.
Third Chinese Office Action for Chinese Application No. 201280048760.9 dated Nov. 22, 2016, 13 pages.
Chinese First Search for Chinese Application No. 201280048760.9 dated Sep. 8, 2015, 2 pages.
Chinese Supplementary Search for Chinese Application No. 201280048760.9 dated Nov. 10, 2016, 2 pages.
Chinese Notification of Fourth Office Action for Chinese Application No. 201280048760.9 dated May 15, 2017, 6 pages.
Korean Notice of Final Rejection for Korean Application No. 10-2014-7009324 dated May 30, 2019, 4 pages.

\* cited by examiner

MULTI JUNCTIONS IN A SEMICONDUCTOR DEVICE FORMED BY DIFFERENT DEPOSITION TECHNIQUES

CROSS-REFERENCE TO RELATED APPLICATION

This application is a national phase entry under 35 U.S.C. § 371 of International Patent Application PCT/IB2012/002062, filed Oct. 8, 2012, designating the United States of America and published in English as International Patent Publication WO2013/054184 A1 on Apr. 18, 2013, which claims the benefit under Article 8 of the Patent Cooperation Treaty to France Application Serial No. 1159154, filed Oct. 11, 2011, the disclosure of each of which is hereby incorporated herein in its entirety by this reference.

TECHNICAL FIELD

The present disclosure generally relates to semiconductor devices including multiple pn junctions formed on the basis of semiconductor compounds that are provided in a substantially lattice-matched configuration.

BACKGROUND

Semiconductor products have been fabricated on the basis of silicon over the past 50 years, thereby providing integrated circuits, systems on chip (SoC), storage devices, optoelectronic components, such as lasers, photodiodes, and, due to economic and environmental issues, solar cells, which are believed to play a very important role in the future energy management in a local and global manner. Due to the ever increasing demands with respect to operating speed, packing density and production costs, very efficient manufacturing techniques have been developed in the past decades, in particular with respect to processing silicon and related materials.

BRIEF SUMMARY

Although silicon is preferably used in mass production environments due to its nearly unlimited availability and the plurality of well-established process techniques and process tools, there is nevertheless an increasing demand for specifically designed semiconductor material is in order to address specific needs, for instance, with respect to operating speed, optical behavior, and the like. For example, one extremely quickly developing area in the field of semiconductors is the fabrication of optoelectronic devices, such as sensors, and the like, which may possibly be monolithically integrated into a semiconductor device. For example, one application of a photodiode in the field of semiconductor fabrication that is increasingly gaining in importance is the fabrication of solar cells, which can be understood as specifically designed photodiodes so as to obtain radiation dependent output power from the photodiode. In a solar cell typically at least one pn junction is provided that acts as an internal electric field source, which thus allows the separation of electron/hole pairs, which are generated by absorption of an incoming photon. Basically, the optical behavior, i.e., the conversion of photons into electron/hole pairs, depends on the band gap energy of the semiconductor material used. For example, a crystalline silicon material has typically a band gap energy of 1.1 eV, which thus allows the absorption of visible light, however, results in a substantial transparency of the silicon material for longer wavelengths in the infrared range. Furthermore, since in crystalline silicon the absorption of light only slowly increases with the thickness of the material, relatively thick crystalline materials are required, for instance, in the range of a hundred to several hundred micrometers, thereby requiring significant amount of silicon materials in order to fabricate crystalline solar cells. Moreover, due to the specific band gap energy the theoretical and practical overall efficiency of solar cells made from crystalline silicon material is very limited, since, for instance, even though photons having a wavelength above the near infrared range may be absorbed in the silicon material, the "excess" energy of the higher energy photons absorbed is converted into heat. Hence, a significant part of the radiation, although efficiently absorbed in the silicon material, does not contribute to the output power and even reduces the overall efficiency due to the significant temperature dependence of the output power of silicon solar cells made of crystalline silicon.

For these reasons it has been proposed to use specifically designed semiconductor materials in order to appropriately adapt the band gap energy to the spectrum of the incoming radiation. Since typically a single pn junction suffers from reduced efficiency due to the compromise between minimum wavelength and waste heat generation, the concept of tandem junctions or multiple junctions semiconductor devices has been introduced, wherein a pn junction is provided in a semiconductor material that has a first band gap energy, while at least one additional pn junction is implemented in a semiconductor material having a second band gap energy so as to cover a broader range of incoming radiation that may efficiently be converted into electron/hole pairs.

For example, III-V semiconductor compounds have proven to be highly efficient materials, which may allow an appropriate band gap engineering while at the same time well-established efficient material deposition techniques can be used so as to form the different semiconductor materials as a stacked layer configuration. In particular gallium arsenide (GaAs) is a semiconductor compound that allows in combination with other species, such as phosphorous, indium, aluminum, and the like, to form compound semiconductor layers, wherein the band gap energy can be adjusted from approximately 2 eV to approximately 1 eV and even less. Furthermore, gallium arsenide can be deposited on well-established semiconductor materials, such as germanium, in a substantially lattice matched configuration, thereby reducing the amount of lattice defects at the interface between the substrate and the gallium arsenide semiconductor material. During the advance of the semiconductor technology highly efficient growth techniques have been established, wherein chemical vapor deposition (CVD) based concepts are used, in which process parameters are selected such that the growth of the material may substantially occur on the basis of the lattice structure of the underlying "template" material. Consequently, when using a crystalline template material the subsequently grown semiconductor material is also provided in a crystalline structure having substantially the same type and size of lattice compared to the template material. In this case, hereinafter, a corresponding deposition process will be referred to as an epitaxial growth process, wherein the term lattice matched may thus correspond to the fact that the grown semiconductor material has a lattice with a lattice constant that deviates by 5% or less with respect to the underlying template material.

In some epitaxial growth techniques the atomic species used for other semiconductor compounds are typically provided in the form of metal organic precursor materials, which are vaporized and applied in a gaseous ambient. By appropriately controlling the process parameters a controlled thickness of the semiconductor compound having a desired material composition may be grown at a moderate growth rate. Another well-established epitaxy technique is molecular beam epitaxy (MBE), in which molecules are directed to the substrate surface under high vacuum conditions, thereby initiating a crystal growth of a semiconductor material. By controlling the various molecule sources and by controlling the molecular beam itself, highly complex semiconductor compounds can be formed with a thickness of several atomic layers, two several hundred nanometers or more. Generally, these epitaxial growth techniques are used for fabricating complex semiconductor devices, for instance, in particular solar cells, in which two or more semiconductor layers having appropriately designed band gap energies are formed in a sequence of deposition processes.

It has been recognized that in particular the provision of at least one semiconductor material with a band gap energy in the range of 0.9 to 1.3 eV is, in combination with one or more additional semiconductor materials having band gap energies in the range of 2.0 to 1.5 eV, is very efficient in order to obtain a very high overall conversion efficiency. For example, triple junction solar cells based on gallium arsenide have been reported with a total efficiency of more than 40% when exposed to concentrated solar radiation. Such high-efficiency solar cells have been fabricated by implementing a bottom sub cell with a band gap energy of approximately 1.0 eV, thereby allowing an efficient conversion of radiation in the near infrared range. In some approaches a ternary gallium-based semiconductor material is used for the bottom sub cell, which is provided as a lattice mismatched layer compared to the remaining two gallium based sub cells having a band gap energy of 1.4 and 1.9 eV, respectively. The semiconductor layers have been grown on the basis of metal organic CVD (MOCVD), wherein a moderately thick graded buffer layer has been provided between the middle sub cell and the bottom lattice mismatched semiconductor layer in order to reduce the number of lattice defects, which are typically associated with a lattice mismatched growth of a semiconductor material.

In other strategies it has been recognized that an efficient band gap engineering in the range of 0.9 to 1.35 eV may be realized by incorporating nitrogen into a gallium-based semiconductor material, such as GaInNAs and GaInNAsSb, wherein also a lattice matched configuration can be achieved with respect to other gallium-based semiconductor compounds. To this end, however, a precise control of the nitrogen contents in the semiconductor compound is necessary in order to combine a lattice matched configuration and a desired band gap energy. In sophisticated molecular beam epitaxy techniques biased deflector plates are typically used in order to appropriately control the nitrogen contents upon depositing the semiconductor material. Based on this concept appropriate semiconductor layer stacks have been formed by MBE in order to provide a solar cell with high efficiency when exposed to concentrated solar radiation.

Although MBE-produced semiconductor layer stacks for solar cell applications provide for high-efficiency, the overall production cost is extremely high and process robustness in volume production techniques is at least highly questionable when using MBE processes. On the other hand, a precise control of the nitrogen content in gallium-based semiconductor layers is extremely difficult to be achieved in MOCVD techniques, thereby rendering the concept of using diluted nitrogen gallium-based semiconductor layers as less attractive for forming sophisticated semiconductor devices, such as solar cells with superior efficiency, in particular since corresponding MBE process tools require increased maintenance and generally exhibit reduced availability, for instance, compared to MOCVD process tools. Conventional approaches for providing low band gap energies on the basis of lattice mismatched gallium-based semiconductor layers, on the other hand, require sophisticated MOCVD processes, since, for instance, appropriate buffer layers are required, which involve a very complex process control for providing the graded semiconductor material with the required thickness. Hence, in this case moderately long process times and thus increased production costs have to be dealt with.

It is, thus, an object of the present disclosure to provide manufacturing techniques and semiconductor devices, in which multiple pn junctions, i.e., semiconductor layers with corresponding pn junctions formed therein, may be provided on the basis of a compound semiconductor material, such as gallium arsenide, in particular for solar cell applications, while avoiding or at least reducing the effects of one or more of the problems identified above.

Generally, the present disclosure addresses the above identified object by providing semiconductor devices, and in particular solar cells, and manufacturing techniques, in which critical semiconductor layers and thus pn junctions of the semiconductor device may be formed on the basis of MBE techniques, for instance, by forming a nitrogen-containing compound semiconductor material in a lattice matched manner, while other semiconductor compounds are formed on the basis of CVD techniques, thereby providing for overall process robustness and efficiency.

According to one aspect of the present disclosure, a method of forming a plurality of pn junctions in a semiconductor device is provided. The method comprises performing a chemical vapor deposition process so as to form a first crystalline semiconductor layer comprising a first pn junction of the semiconductor device. The method further comprises performing a molecular beam epitaxy process so as to form a diluted nitrogen semiconductor material as a second crystalline semiconductor layer comprising a second pn junction of the semiconductor device.

As discussed above, molecular ion beam epitaxy is an appropriate epitaxy technique for providing nitrogen-containing semiconductor compounds so that advantageously the nitrogen contents can be reliably and precisely controlled, thereby enabling a precise adjustment of the band gap energy while also enabling the fabrication of lattice matched compound semiconductor materials.

In a further illustrative embodiment, the method further comprises forming at least one additional crystalline semiconductor material by performing at least one additional chemical vapor deposition process, wherein the at least one additional crystalline semiconductor layer comprises an additional pn junction. Hence, a plurality of pn junctions are provided in the semiconductor device, wherein most of the semiconductor layers are formed on the basis of CVD techniques, thereby obtaining superior process uniformity and throughput upon forming the semiconductor compounds in a lattice matched manner.

In a further illustrative embodiment, the method further comprises providing a substrate and forming the first and second crystalline semiconductor layers above the substrate. In this embodiment, the same substrate material is used for sequentially performing the CVD process and the MBE process, thereby avoiding additional process techniques for combining semiconductor layers that may be fabricated on the basis of different substrates.

In one illustrative embodiment, each semiconductor layer is formed above the substrate. Consequently, a process sequence is applied, in which any semiconductor compound of the device is formed in a sequential manner above the same substrate, providing for an overall reduced thickness of the resulting stack of semiconductor layers, since any intermediate material layers may be provided with a well controlled and reduced thickness, for instance, compared to substrate bonding techniques, and the like.

In a preferred embodiment, the first and second semiconductor layers are formed as parts of a stacked layer configuration. In this manner, particularly highly efficient semiconductor devices, such as solar cells, are provided, since the semiconductor layers of appropriately adapted band gap energies may be provided in the stacked layer configuration so as to obtain a high overall degree of radiation absorption and thus increased conversion efficiency, while enabling an efficient series connection of the various pn junctions. Furthermore, the various sub cells of the stacked layer configuration may appropriately be adapted to each other in order to provide substantially the same current, when responding to an external optical radiation, thereby also providing for superior overall efficiency.

In one illustrative embodiment, the first semiconductor layer is formed prior to forming the second semiconductor layer. In this case, the first and second semiconductor layers may be formed in a sequential manner, wherein, however, the MBE process is performed after providing the first semiconductor layer on the basis of a CVD technique so that disadvantageous effects, such as nitrogen diffusion, and the like, may substantially be avoided, since, for example, the high temperature requirements of the CVD process may not affect the subsequently deposited diluted nitrogen semiconductor compound. In some illustrative embodiments any additional semiconductor compounds, which may have to be provided on the basis of a CVD technique may be formed on a separate substrate and may be bonded to the diluted nitrogen semiconductor compound by substrate bonding, and the like, if exposure of the nitrogen-containing semiconductor compound to the CVD atmosphere is considered inappropriate.

In one preferred embodiment, the method further comprises providing a first substrate and a second substrate, forming the first semiconductor layer above the first substrate and the second semiconductor above the second substrate and bonding the first and second substrates. Consequently, by providing separate substrates for the first and second semiconductor layers in particular any negative effect, for instance, the effect of increased temperature, on the nitrogen-containing semiconductor compound may substantially be avoided. Furthermore, appropriate substrate materials, such as gallium arsenide, germanium, or even specifically designed substrates, such as germanium on sapphire or GaAs on sapphire, and the like may efficiently be used in the CVD process and the MBE process, thereby in handling overall process flexibility. Moreover, by providing different substrates a certain degree of parallel processing may be implemented in the overall process flow, which may be advantageous in increasing overall throughput and generally achieving superior flexibility and thus efficiency in scheduling the overall process flow in a given manufacturing environment.

In one illustrative embodiment, one or more of the at least one further semiconductor layer is formed above the second substrate prior to forming the second semiconductor layer. In this embodiment a "mixture" of serial and parallel processing may be established upon forming a plurality of semiconductor compounds, wherein nevertheless disadvantageous effects of the CVD processes on the nitrogen containing semiconductor compound may substantially be avoided. That is, typically the CVD process atmosphere may have a negative influence on the previously formed nitrogen-containing semiconductor compound, for instance, in terms of nitrogen diffusion, and the like, while on the other hand the MBE process may be performed on the basis of any previously CVD deposited semiconductor compound substantially without any negative effects. Consequently, a plurality of CVD layers may be provided above the first and second substrates on the basis of a process strategy, which enables the formation of the MBE semiconductor compound as a "last" epitaxially grown semiconductor material in order to avoid any undue interaction with a CVD process atmosphere. Thereafter, the various semiconductor layers provided above the first and second substrates may be combined by any appropriate technique, such as substrate bonding, and the like.

In a further illustrative embodiment, the method further comprises providing an additional substrate and forming at least one of the at least one further semiconductor layers above the further substrate. That is, if a plurality of semiconductor compounds are to be provided three or more different substrates may be used in order to enhance overall flexibility in combining the various layers while at the same time ensuring a high degree of parallelism of the manufacturing flow, while any negative effects of the CVD processes and the MBE process may be avoided. For example, in illustrative embodiments, the diluted nitrogen semiconductor compound may be provided on a dedicated substrate so as to avoid the deposition a CVD material prior to and after the MBE process. In this case, a maximum "decoupling" of the MBE process from any CVD related process techniques may be achieved. Moreover, a high degree of flexibility may be obtained in finally composing the resulting layer stack, wherein the MBE semiconductor compound may be positioned at any appropriate height level within the entire layer stack, while nevertheless avoiding any undue interaction with CVD process atmospheres, as discussed above.

In one illustrative embodiment, the first and second semiconductor layers are formed as a III-V semiconductor compound. Hence, as previously explained, these semiconductor layers may efficiently be used in a solar cell in order to appropriately provide a plurality of different band gap energies in order to enhance overall efficiency of the solar cell. Moreover, three or more semiconductor compounds in the form of III-V materials may be provided, wherein the nitrogen diluted semiconductor compound may enable the provision of a band gap energy of approximately 0.9 to 1.35 eV, while also a lattice matched configuration of any of the semiconductor compounds is achieved.

According to another aspect of the present disclosure, there is provided a semiconductor device, which comprises a first semiconductor layer comprising a first pn junction formed above a substrate. The semiconductor device further comprises a second semiconductor layer comprising a second pn junction formed above the first semiconductor layer, wherein the second semiconductor layer comprises a diluted nitrogen III-V semiconductor compound. Furthermore, the semiconductor device includes a third semiconductor layer comprising a third pn junction formed above the substrate, wherein the first, second and third semiconductor layers are provided as lattice-matched semiconductor layers.

As discussed above, the semiconductor materials are provided as lattice matched compounds including a nitrogen containing III-V semiconductor compound, thereby enabling an efficient adjustment of band gap energies, even in a range below 1.3 eV based on the nitrogen-containing compound, while generally the amount of lattice defects may be reduced.

In one illustrative embodiment, the first, second and third semiconductor layers are provided without any intermediate strain buffer material, thereby ensuring a very compact stacked configuration, which may be provided on the basis of reduced overall process time compared to conventional semiconductor devices, in which typically semiconductor materials with reduced band gap energy may require a lattice mismatched configuration. Hence, in these conventional devices, typically a strain buffer layer of appropriate thickness is required in order to reduce overall lattice defects.

In a further preferred embodiment, the semiconductor device further comprises at least one further lattice-matched semiconductor layer formed above the third semiconductor layer. Hence, even highly sophisticated semiconductor devices with four or more pn junctions may be provided, wherein each of the semiconductor layers is fabricated as a lattice matched semiconductor material, wherein also in this case any intermediate strain buffer layers may be avoided by applying the above-described process techniques.

In one preferred embodiment, the semiconductor device is a solar cell. Hence, as discussed above, an appropriate band gap engineering may be applied in order to enhance overall conversion efficiency by appropriately covering the spectrum of the solar radiation using in particular a nitrogen-containing semiconductor compound. In this manner, in particular solar cells for concentrated solar radiation may be formed on the basis of a highly efficient overall stacked configuration, wherein superior process robustness and efficiency may be accomplished by using the above-described process techniques.

According to a further aspect of the present disclosure, the object is solved by a method of forming a solar cell. The method comprises forming a first semiconductor layer above a substrate of the solar cell by performing a first process sequence including a molecular beam epitaxy process. The method further comprises forming a second semiconductor layer above the substrate by performing a second process sequence including a chemical vapor deposition process, wherein the first and second semiconductor layers are lattice-matched.

In this aspect of the present disclosure, a solar cell is fabricated on the basis of a hybrid process strategy, in which CVD techniques and a molecular beam epitaxy are used so as to provide at least two different semiconductor layers. As discussed above, preferably the first semiconductor layer is formed on the basis of a nitrogen-containing semiconductor compound, which may efficiently be formed on the basis of MBE techniques in order to provide a desired band gap energy without requiring sophisticated strain buffer layers while nevertheless providing for a reduced number of lattice defects due to the lattice matched configuration.

In a further illustrative embodiment, at least one of the first and second process sequences comprises providing a respective auxiliary substrate so as to form a respective semiconductor layer above the respective auxiliary substrate and bonding the respective auxiliary substrate to the substrate. Consequently, in this process strategy the first and second semiconductor layers may be formed on the basis of different substrates, thereby providing for a high degree of flexibility in organizing and scheduling the entire process flow while at the same time reducing any interaction between the two different process techniques. On the other hand, any desired order of the semiconductor layers may be obtained by appropriately bonding the different substrate materials or semiconductor layers. In some cases, the semiconductor layers and any additional materials may be applied above the substrate in an appropriate order so as to provide an "inverted" configuration that is appropriate for a subsequent bonding sequence so as to directly attach the semiconductor material to a layer or substrate material.

In one preferred embodiment, the first semiconductor layer is formed so as to have a band gap energy in the range of 0.9 eV to 1.3 eV. Hence, the first semiconductor layer is appropriately selected with respect to its band gap energy so as to provide for overall superior conversion efficiency, in particular as a superior crystalline quality is achieved. Furthermore, the process strategy enables reduced overall process time and superior flexibility in providing a plurality of semiconductor layers of appropriate band gap energies for solar cells application, thereby contributing to competitiveness of solar cells formed on the basis of III-V semiconductor compounds.

BRIEF DESCRIPTION OF THE DRAWINGS

The above-described embodiments and further specific embodiments of the present disclosure, will become more apparent from the following description when referring to the accompanying drawings, in which.

DETAILED DESCRIPTION

Figure 1A:
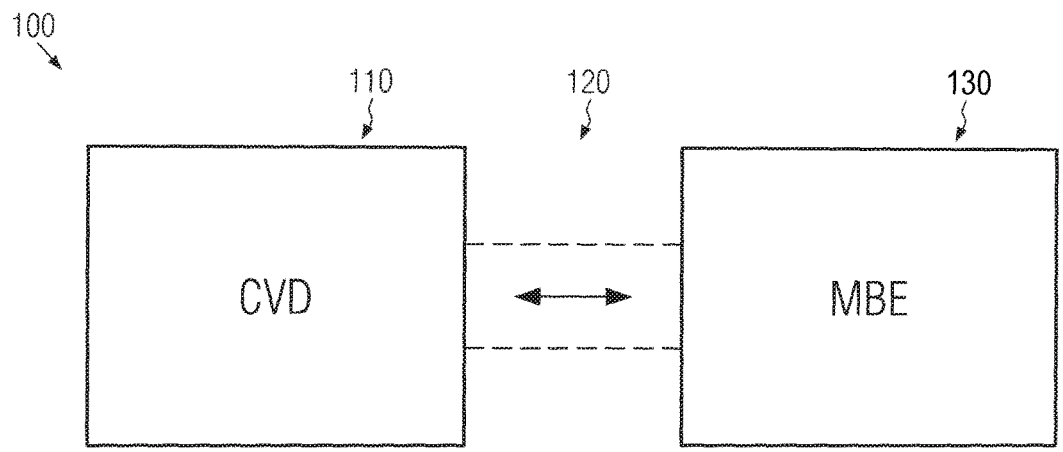
FIG. 1a schematically illustrates a process environment including a CVD process tool used for epitaxially growing semiconductor materials on the basis of MOCVD and a molecular beam epitaxy process tool used for forming a lattice matched semiconductor compound, such as a diluted nitrogen III-V semiconductor compound, FIG. 1b schematically illustrates various steps of a manufacturing sequence, in which the environment of FIG. 1a is used for providing a plurality of semiconductor compounds in a stacked configuration above a common substrate according to illustrative embodiments, FIG. 2 schematically illustrates a process flow according to further illustrative embodiments, in which CVD epitaxy processes and MBE processes are performed on the basis of a common substrate while still avoiding undue negative effects of the CVD process on the MBE process, while additional semiconductor compounds may be formed above a separate substrate on the basis of CVD techniques, FIG. 3 schematically illustrates a process flow, in which semiconductor compounds are formed on the basis of two or more dedicated substrates, while the MBE layer is processed on the basis of a separate substrate according to illustrative embodiments, and FIG. 4 schematically illustrates a cross-sectional view of a semiconductor device, such as a solar cell, comprising three or more semiconductor compounds in a stacked configuration and provided in a lattice matched structure using the above-described process techniques, according to further illustrative embodiments of the present disclosure.

FIG. 1a schematically illustrates a manufacturing environment 100 that is appropriate for fabricating semiconductor devices, such as solar cells, and the like. The environment 100 comprises, in addition to any other process tools (not shown), at least one or more CVD tools 110, which are appropriately configured in order to enable the epitaxial deposition of semiconductor materials, such as III-V semiconductor compounds, II-VI semiconductor compounds, and the like. As discussed above, typically when forming a crystalline semiconductor compound material the precursor may be provided in the form of metal organic precursor materials, wherein appropriate process parameters are selected such that a desired gaseous environment is established in the tools 110, thereby enabling the epitaxial growth of a semiconductor material on an appropriate template material or substrate.

Moreover, the manufacturing environment 100 further comprises one or more process tools 130, which are appropriate for performing a molecular beam epitaxy process, as discussed above. In particular, the required high vacuum environment may be established in the process tool 130, while, as also explained before, additional components may be provided so as to allow a precise control of the various atomic species to be incorporated in a semiconductor compound under consideration. In particular, the tool 130 is appropriately configured to control the incorporation of a nitrogen species into a semiconductor compound, for instance, on the basis of biased deflector plates, and the like, thereby enabling the epitaxial growth of diluted nitrogen semiconductor compounds, which are known to enable a lattice matched growth on gallium arsenide substrates and which provide for a band gap energy in the range of 0.9 to 1.35 eV.

Furthermore, in some illustrative embodiments, the process tools 110 and 130, which have to be operated on the basis of significantly different pressure conditions, or operatively connected by a transport mechanism 120 that enables the exchange of substrates without undue exposure to the ambient atmosphere of the manufacturing environment 100. For example, the transport mechanism 120 may be implemented in a cluster tool, thereby minimizing the required transport activities. It should be appreciated, however, that the process tools 110, 130 may represent separated process tools, wherein the transport of substrates may be established on the basis of the mechanism 120, which includes manual or automated transport systems on the basis of appropriate transport containers.

Figure 1B:
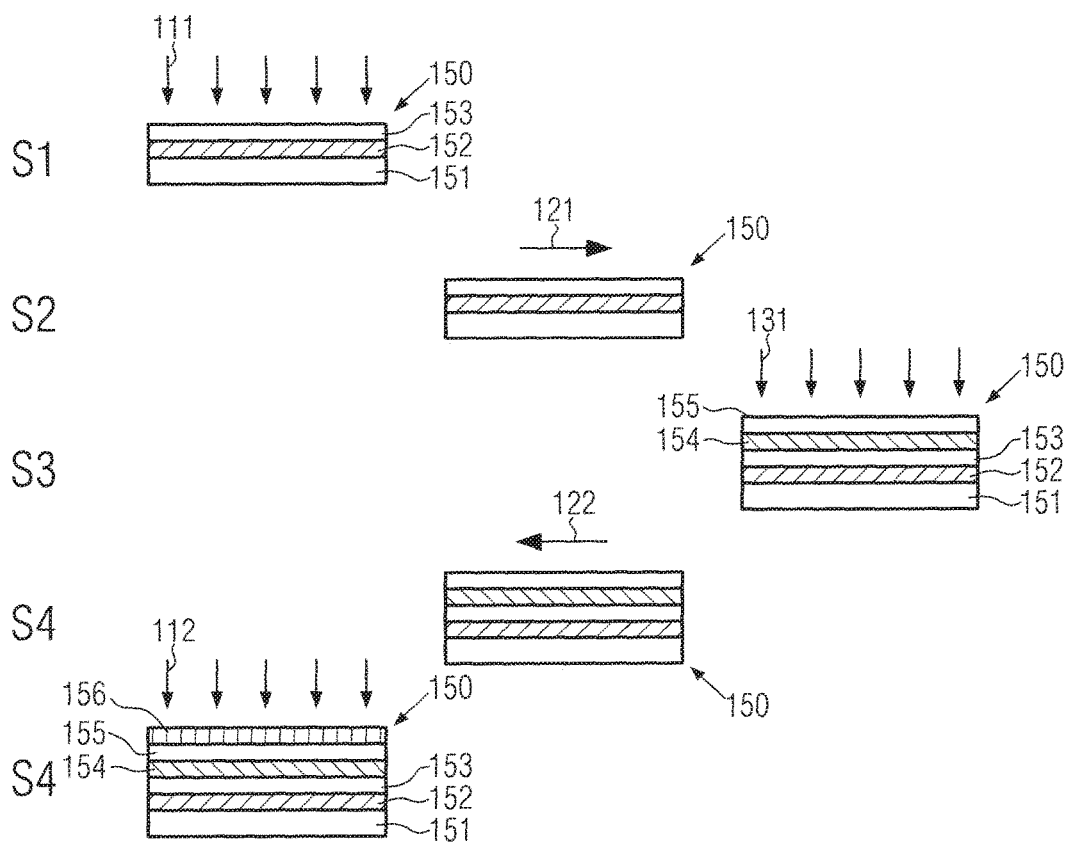

FIG. 1*b* schematically illustrates a manufacturing process sequence, in which a plurality of semiconductor layers including pn junctions are formed in a stacked layer configuration, wherein at least most of the semiconductor layers are provided as semiconductor compounds having appropriately selected band gap energies and with a lattice matched configuration. To this end, the manufacturing environment 100 of FIG. 1*a* may be used so as to form a semiconductor device 150, such as a solar cell, by applying two or more semiconductor layers above a common substrate 151. In the embodiment shown, in a first step S1 the CVD process tool 110 is used in order to perform an epitaxial deposition process 111 so as to epitaxially grow a semiconductor layer 152 above the substrate 151, which may be provided in the form of a germanium substrate, and the like. As discussed above, the semiconductor layer 152 may be provided in the form of a gallium arsenide based semiconductor material or a germanium-based semiconductor material including a pn junction (not shown), which is typically formed during the deposition process 111 by introducing appropriate p-type and n-type dopants, as is well known in the art. Furthermore, as discussed above, the semiconductor layer 152 is provided in a lattice matched configuration, i.e., any specific strain buffer layers between the semiconductor layer 152 and the substrate 151 are not required. The deposition process 111 may further include the deposition of an intermediate layer 153, which may be provided in the form of a tunnel junction layer so as to provide for optical and electrical connection to an additional semiconductor layer to be formed above the substrate 151 in a later manufacturing stage.

In step S2 the device 150 is subjected to a transport activity 121, for instance, on the basis of the transport mechanism 120 of FIG. 1*a*, possibly without requiring any additional transport containers, and the like, when the environment 100 is provided in the form of a cluster tool.

In step S3 the device 150 may be processed in the process tool or tools 130 in order to deposit a semiconductor material on the basis of an MBE process 131, wherein in preferred embodiments, a nitrogen-containing semiconductor compound layer 154 is epitaxially grown on the previously deposited intermediate layer 153. As discussed above, the process parameters and the hardware configuration of the tool 130 are adjusted such that a precisely defined fraction of nitrogen is incorporated into the semiconductor layer 154, which may additionally comprise gallium, arsenic and indium (GaInNAs), possibly in combination with antimony (Sb). Hence, the semiconductor layer 154 may be deposited in a lattice matched manner with a desired band gap energy, which is preferably adjusted to be within the range of 0.9 to 1.35 eV. Furthermore, an additional intermediate or transition layer 155 may be formed on the semiconductor layer 154 during the epitaxial growth process 131 so as to provide optical and electrical connection to one or more further semiconductor layers to be formed in the semiconductor device 150. In the process strategy shown in FIG. 1*b*, the layers 154 and 155 may represent the only semiconductor materials to be provided on the basis of an MBE growth process, while it should be appreciated that in other cases one or more further semiconductor layers may be grown on the basis of molecular beam epitaxy.

In step S4 the device 150 is again subjected to a transport activity 122, for instance, using the transport mechanism 120, in order to introduce the device 150 into a process environment for depositing one or more further semiconductor layers on the basis of CVD techniques.

In step S5 the device 150 is exposed to an additional CVD deposition atmosphere 112, for instance, established in the tool 110 or in any other CVD process tool in order to form at least one further semiconductor compound 156 on the previously deposited transition layer 155. In one illustrative embodiment, the semiconductor compound layer 156 may be provided in the form of a gallium arsenide semiconductor material, possibly followed by an additional semiconductor compound, such as InGaP, if an additional optically active semiconductor material is required. Thereafter, an additional transition layer may be provided during the deposition process 112. In this case, three or more semiconductor layers of appropriate band gap energy are provided in the device 150 on the basis of the two CVD deposition processes 111 and 112, while the optically active region 154 is provided on the basis of molecular beam epitaxy in order to provide a lattice matched nitrogen-containing semiconductor compound.

It should be appreciated, however, that any number of semiconductor compounds may be provided in a stacked configuration by using the two different deposition techniques, wherein the order of the layers may be selected in accordance with the band gap energies required for obtaining an optimized absorption and conversion efficiency.

Figure 2:
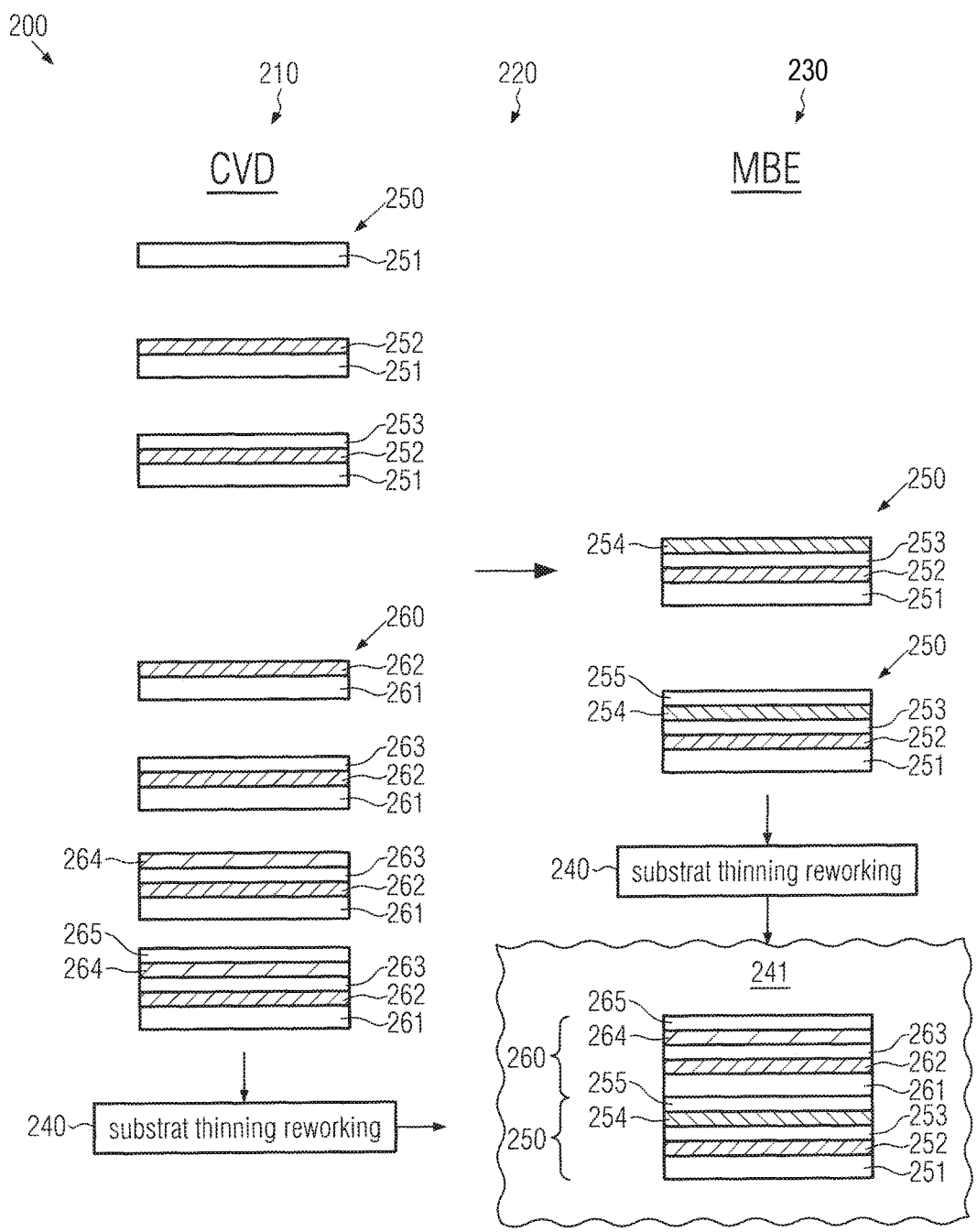
Figure 3:
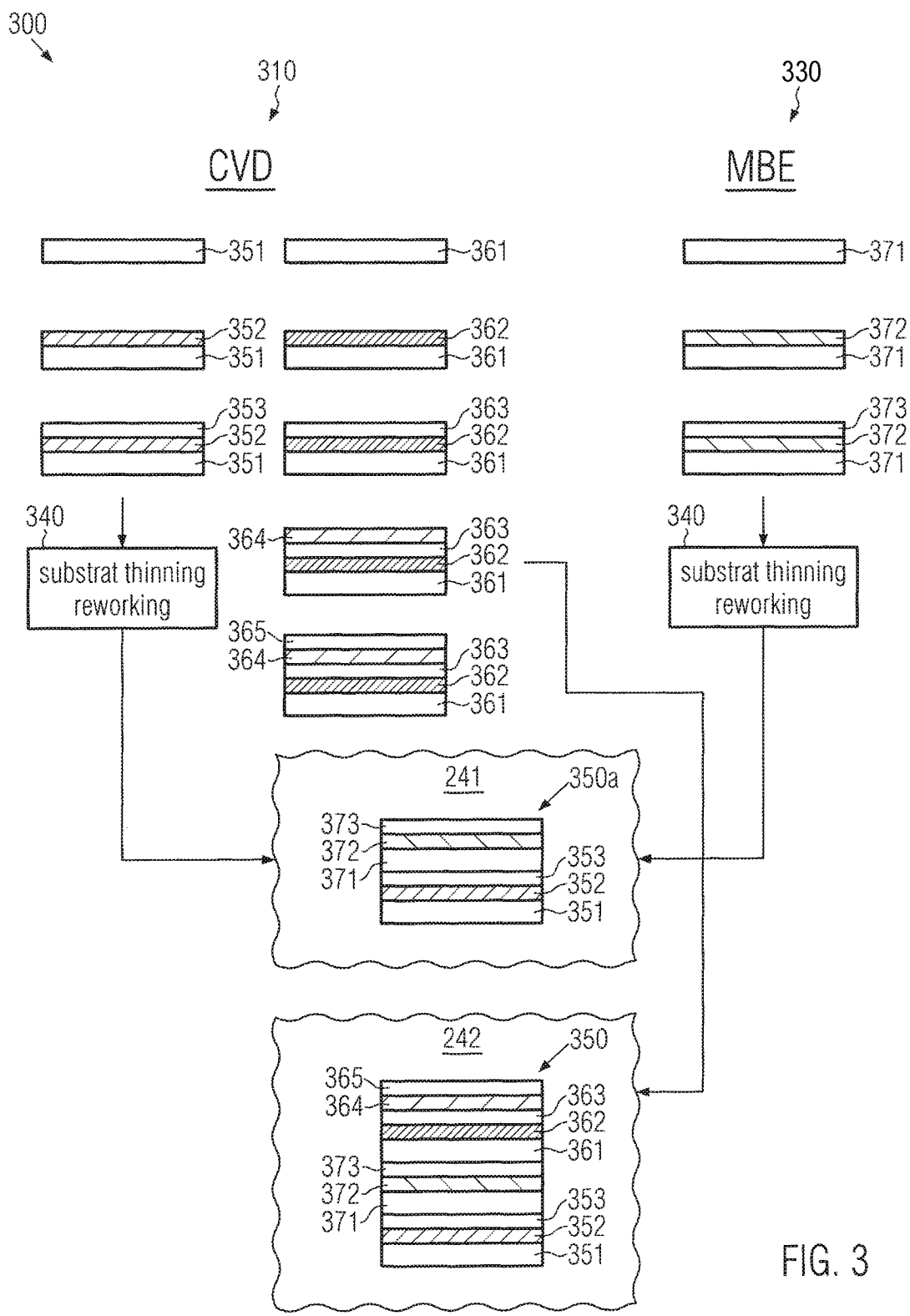

With reference to FIGS. 2 and 3, further illustrative embodiments will now be described in more detail, in which superior flexibility in designing the overall process flow is achieved, in particular when, for instance, the further deposition by CVD techniques on the previously epitaxially formed semiconductor compound achieved by molecular beam epitaxy is considered inappropriate, for instance, due to a certain degree of nitrogen diffusion, and the like.

FIG. 2 schematically illustrates a manufacturing environment 200, which may comprise one or more CVD process tools 210, a transport mechanism 220 and one or more MBE process tools 230. With respect to any hardware configurations of the environment 200 the same criteria may apply, as previously discussed, with reference to FIG. 1a and the environment 100.

In the environment 200 a process sequence may be implemented, in which the deposition of a semiconductor compound on a nitrogen-containing semiconductor compound formed on the basis of MBE is avoided in order to reduce the probability of any interaction of the CVD deposition atmosphere with a previously formed semiconductor material grown by MBE. To this end, a semiconductor device 250 may comprise an appropriate substrate 251, such as a germanium substrate and the like, which is subsequently processed in the CVD process environment 210 in order to form a first doped layer 252 including a pn junction followed by an additional layer 253, which provides for optical and electrical connection to an additional semiconductor layer to be formed above the substrate 251. For this purpose the device 250 is transported to the MBE environment 230, for instance, using the transport mechanism 220 and a diluted nitrogen semiconductor compound 254 is formed in a lattice matched manner, as discussed above. Furthermore, an appropriate intermediate or transition layer 255 is formed on the basis of the MBE tool in the environment 230, thereby completing a first portion of the required semiconductor layer stack in the device 250. That is, in this embodiment no additional semiconductor materials are formed by CVD techniques, thereby avoiding a direct exposure of the MBE-grown semiconductor materials to a CVD deposition atmosphere.

Furthermore, concurrently or at any appropriate stage of the overall manufacturing process a second semiconductor device 260 comprising an appropriate substrate 261, such as a gallium arsenide substrate, may be processed in the CVD deposition environment 210 in order to form a lattice matched doped semiconductor material 262 including a pn junction thereon, such as a gallium arsenide layer, and the like. Next, an intermediate or transition layer 263 may be grown in order to provide optical and electrical conductivity to an additional semiconductor compound to be formed above the layer 262. Hence, in an additional deposition step an appropriate material 264, such as InGaP is grown in combination with a final contact layer 265, which provides for the desired optical and electrical characteristics as the final layer of the entire layer stack still to be formed.

In this stage the substrate 261 is processed in an additional manufacturing environment 240 in order to reduce the thickness of the substrate 261 or generally to rework the substrate 261 so as to remove a portion thereof, if, for instance, a specific engineered substrate has been used. In this case, the removed portion of the engineered substrate may be re-used for forming thereabove semiconductor layers for any further semiconductor device. Similarly, the device 250 is processed in the manufacturing environment 240 so as to thin the substrate 251 or remove a portion thereof, which may be re-used in an additional process sequence. Thereafter, the processed devices 260 and 250 are combined in a manufacturing environment 241, thereby forming the completed device 250 including a stacked layer configuration including the layers 262 to 265 formed above the substrate 261 and the layers 252 to 255 formed above the substrate 251 on the basis of a combination of CVD deposition techniques and MBE deposition techniques, as described above. For example, as shown, in the device 260 the second substrate 261 may act as a transparent and conductive material immediately followed by the semiconductor layers 262, . . . , 265, which may represent a doped semiconductor material for providing a pn junction in combination with an intermediate semiconductor material, followed by an InGaP layer, as, for instance, also described above with reference to FIG. 1b, followed by the final contact layer 265.

It should be appreciated that the semiconductor materials formed by CVD techniques above the substrate 261 may thus be formed in a sequence that allows the bonding of the device 260 on the basis of the substrate 261, while in other cases an inverted configuration may be provided, wherein the device may be bonded upside down to a substrate or layer of the other device, while a remaining portion of the substrate 261 may be removed, for instance, in the process environment 240. The removal of a portion of the substrate 261 may be accomplished by using well-established smart cut technologies, thereby providing for superior overall process efficiency due to the re-usability of the removed substrate portion.

Consequently, according to this embodiment, three semiconductor layers including corresponding pn junctions in combination with the final InGaP may be provided on the basis of a hybrid deposition strategy, wherein, the deposition of a CVD material above the nitrogen-containing semiconductor compound grown by MBE is avoided.

FIG. 3 schematically illustrates a manufacturing environment 300 including a CVD process environment 310 and an MBE process environment 330. In this process environment 300 a process strategy is implemented, in which at least a semiconductor compound formed on the basis of MBE is provided on a dedicated substrate without providing any further semiconductor materials thereon on the basis of CVD techniques. Furthermore, at least two further semiconductor materials may be formed above respective substrates on the basis of CVD techniques, thereby also providing for superior process flexibility and increased parallelism of the overall process flow. As shown, a substrate 351, such as a germanium substrate, is provided for a first deposition process in the environment 310 in order to form thereon a doped semiconductor layer 352, followed by an appropriate intermediate or transition layer 353. In this manner, an appropriate first pn junction is implemented in a lattice matched manner on the basis of a CVD technique. Furthermore, a second substrate 361, such as a gallium arsenide material, is processed in the environment 310 in order to provide one or more semiconductor materials including respective pn junctions, which have to be provided in a later manufacturing stage in a stacked configuration above an additional semiconductor compound that is to be formed on the basis of an MBE deposition technique.

In the embodiment shown, a first semiconductor layer 362 is grown, followed by a transition layer 363. Furthermore, an additional semiconductor compound, such as InGaP, is provided as a layer 364, followed by an appropriate contact layer that may represent a last layer of a stacked configuration to be formed on the basis of wafer bonding techniques in a later manufacturing stage. Due to the provision of the individual substrates 351 and 361, the corresponding portions of the stacked layer configuration may be provided in parallel or sequentially, depending on the overall availability of process tools, and the like. Consequently, superior scheduling efficiency of the overall manufacturing process is achieved.

Furthermore, a substrate 371, such as a gallium arsenide material, is processed in the environment 330 so as to form thereon a nitrogen-containing semiconductor compound 372 having the desired band gap energy and the lattice matched configuration, as discussed above. Furthermore, an appropriate intermediate or transition layer 373 is positioned above the layer 372. Consequently, the material 372 may be provided in the form of a diluted nitrogen semiconductor compound without being affected by any CVD deposition atmosphere, neither prior to the deposition of the material 372 nor after the deposition thereof.

The various substrates 351, 361 and 371 may be processed in a corresponding process environment 340 in order to perform a thinning process or appropriately remove a portion of these substrates on the basis of smart cut technologies in order to allow a further re-use of these corresponding portions. Thereafter, in a further process environment 341 the substrate 351 is combined with the substrate 371, thereby forming a first intermediate semiconductor device 350a comprising the layer 352 as a first semiconductor layer including a pn junction, followed by the substrate 371, which acts as a transparent and conductive contact material. Next, the nitrogen-containing semiconductor compound 372 is provided in combination with the intermediate layer 373. In this stage the intermediate device 350a may be processed in a further manufacturing environment 342 so as to connect the intermediate semiconductor device 350a to the substrate 361, which may comprise at least the pn junction in the semiconductor layer 362 in combination with the further semiconductor material 364 and the contact layer 365.

It should be appreciated that also in this case the layers 362 and 364, which are formed above the common substrate 361, may also be provided on the basis of separate substrates, if considered appropriate in view of enhancing overall efficiency of the manufacturing sequence. Furthermore, the semiconductor layers provided above one or more of the substrates 351, 371 and 361 may be applied in an inverted configuration so as to allow the direct bonding of any such layers, while thereafter or prior to the bonding a corresponding portion of the respective substrate or substrates may be removed, for instance, by smart cut technologies.

Figure 4:
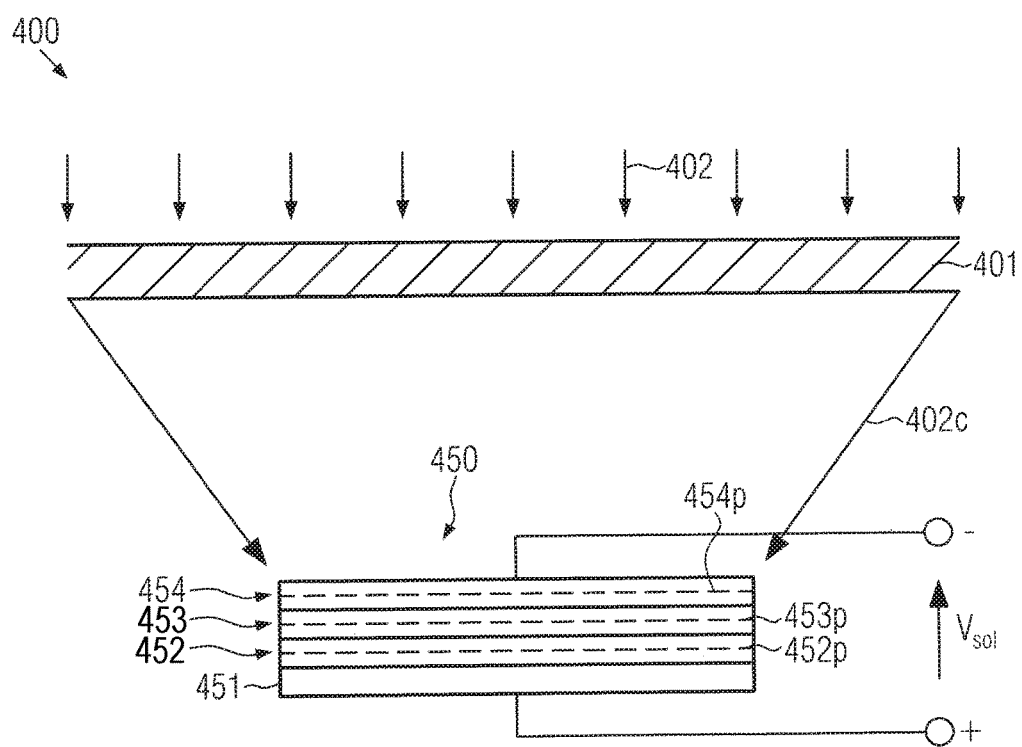

FIG. 4 schematically illustrates a cross-sectional view of a semiconductor device 450 in the form of a solar cell comprising at least three sub cells 452, 453, 454 with corresponding pn junctions 452p, 453p, 454p formed therein, while also any appropriate intermediate layers or transition layers may be provided in the various subs cells in order to establish efficient optical and electrical interconnections, as is also discussed above. The sub cells and the corresponding semiconductor materials are provided as a stacked layer configuration above an appropriate substrate 451, thereby forming a series connection of the sub cells 454, 453, 452 in order to provide output power when solar radiation 402C is directed onto the solar cell 450. For example, the substrate 451 may be a germanium substrate, on which the sub cell 452 is formed on the basis of MOCVD techniques, as is also previously discussed with reference to FIGS. 2 and 3. The sub cell 453 may comprise a semiconductor compound including a well-defined fraction of nitrogen in order to obtain a specific band gap energy and allow an overall lattice matched configuration. The sub cell 454 may thus comprise appropriate lattice matched semiconductor compounds formed by MOCVD. It should be appreciated, however, that any other sequence of MOCVD layers and MBE layers may be implemented, depending on the specific optical and electrical requirements of the solar cell 450. As discussed above, typically the various sub cells have different band gap energies so as to allow a high conversion efficiency for the incoming spectrum of the radiation 402C. Typically, the sub cell 454 representing the top cell of the device 450 may have the greatest band gap energy, while the sub cell 452 may have the lowest band gap energy. Since the semiconductor materials of any of the sub cells 452, . . . , 454 are provided as a lattice matched layer stack, the amount of lattice defects is reduced, which in turn translates into superior conversion efficiency. Consequently, due to the application of the above-described hybrid deposition strategy, any intermediate strain buffer layers are not required in the device 450, thereby also reducing the overall process complexity compared to conventional solar cells, in which at least some semiconductor compounds have to be provided on the basis of a lattice mismatched configuration.

The solar cell 450 may be formed on the basis of process techniques, as described above, with reference to FIGS. 1 to 3, i.e., on the basis of a hybrid deposition strategy, in which at least the nitrogen-containing semiconductor compound material is formed on the basis of MBE, while two or more semiconductor materials are formed on the basis of MOCVD. It should be appreciated that any appropriate number of sub cells may be implemented in the device 450 by using the above-described process strategy. For example, the solar cell 450 may advantageously be applied in situations in which the incoming solar radiation 402C is provided as concentrated radiation, wherein a concentrator element 401 is exposed to the standard solar radiation 402 in order to provide the radiation with an intensity increased by a 2 to several hundred or even more.

What is claimed is:

1. A method of forming a plurality of pn junctions in a semiconductor device, the method comprising:
    providing a substrate;
    performing a chemical vapor deposition process and forming a first crystalline semiconductor layer on the substrate, the first crystalline semiconductor layer comprising a first pn junction of the semiconductor device;
    forming an optical and electrical connection layer on the first crystalline semiconductor layer; and
    after forming the first crystalline semiconductor layer on the substrate, performing a molecular beam epitaxy process and forming a diluted nitrogen semiconductor material as a second crystalline semiconductor layer comprising a second pn junction of the semiconductor device, the diluted nitrogen semiconductor material having a band gap energy in the range of 0.9 eV to 1.3 eV, the optical and electrical connection layer between the first crystalline semiconductor layer and the second crystalline semiconductor layer;
    wherein the second crystalline semiconductor layer is formed over the substrate and lattice matched to the first crystalline semiconductor layer and the substrate;
    wherein the second crystalline semiconductor layer formed by the molecular beam epitaxy process is not subjected to any chemical vapor deposition process performed subsequent to the molecular beam epitaxy process used to form the diluted nitrogen semiconductor material of the second crystalline semiconductor layer;
    wherein the method does not include a formation of any intermediate strain buffer material between the first crystalline semiconductor layer and the second crystalline semiconductor layer; and wherein the optical and electrical connection layer is between, and in direct physical and electrical contact with each of, the first crystalline semiconductor layer and the second crystalline semiconductor layer.

2. The method of claim 1, further comprising forming at least one additional crystalline semiconductor layer by performing at least one additional chemical vapor deposition process prior to forming the diluted nitrogen semiconductor material as the second crystalline semiconductor layer, wherein the at least one additional crystalline semiconductor layer comprises an additional pn junction, and wherein the at least one additional crystalline semiconductor layer is formed over the substrate and lattice matched to the first crystalline semiconductor layer and the substrate.

3. The method of claim 1, wherein the substrate comprises a GaAs substrate or a germanium substrate.

4. The method of claim 3, wherein the diluted nitrogen semiconductor material comprises GaInNAs.

5. The method of claim 3, wherein the diluted nitrogen semiconductor material comprises GaInNAsSb.

6. The method of claim 1, wherein the diluted nitrogen semiconductor material comprises GaInNAs.

7. The method of claim 1, wherein the diluted nitrogen semiconductor material comprises GaInNAsSb.

8. The method of claim 1, further comprising transporting the substrate with the first crystalline semiconductor layer thereon from a chemical vapor deposition process tool to a molecular beam epitaxy tool using a transport mechanism without exposing the substrate and the first crystalline semiconductor layer to an ambient atmosphere of a manufacturing environment, and thereafter forming the second crystalline semiconductor layer over the substrate using the molecular beam epitaxy tool.

* * * * *